United States Patent [19]

Shimizu

[11] Patent Number: 5,478,400
[45] Date of Patent: Dec. 26, 1995

[54] APPARATUS FOR FABRICATING SEMICONDUCTOR DEVICES

[75] Inventor: Noriyoshi Shimizu, Kawasaki, Japan

[73] Assignee: Fujitsu Limited, Kawasaki, Japan

[21] Appl. No.: 355,119

[22] Filed: Dec. 13, 1994

Related U.S. Application Data

[63] Continuation of Ser. No. 113,684, Aug. 31, 1993, abandoned.

[30] Foreign Application Priority Data

Nov. 18, 1992 [JP] Japan ................................. 4-307457

[51] Int. Cl.$^6$ ................................................ C30B 35/00
[52] U.S. Cl. ................................................ 118/733
[58] Field of Search ................................................ 118/733

[56] References Cited

FOREIGN PATENT DOCUMENTS

| | | | |
|---|---|---|---|
| 1-219162 | 9/1989 | Japan . | |
| 3218081 | 9/1991 | Japan | ................................. 118/733 |
| 2184175 | 6/1987 | United Kingdom | ................... 118/733 |
| 9202590 | 3/1992 | WIPO | ..................................... 118/733 |

OTHER PUBLICATIONS

B. Anthony et al, J. Vac. Sci. Technol. B7(4); Jul./Aug. 1989.
C. Vinckier et al, Applied Surface Science 30 (1987) pp. 40–46; 1987.

*Primary Examiner*—R. Bruce Breneman
*Assistant Examiner*—Ramamohan Rao Paladugu
*Attorney, Agent, or Firm*—Staas & Halsey

[57] ABSTRACT

A beam generating apparatus disposed in a vacuum processing chamber for processing a substrate for emitting activated beams into the processing chamber comprises a beam generating cell for generating the activated beams, the beam generating cell having a speculum contact surface, a gas introduction member for introducing gas into the beam generating cell, the gas introduction member having a speculum contact surface, a bellows members connected to the gas introduction member, for pressing the contact surface of the gas introduction member against the contact surface of the beam generating cell so as to vacuum-seal a contact between the beam generating cell and the gas introduction member. At this contact both members are pressed against each other by the resiliency of the bellows, and accordingly higher air-tightness can be provided. A method for fabricating a semiconductor device comprises the steps of heating a silicon substrate to a temperature below 700° C., and irradiating neutral oxygen radical beams and neutral hydrogen radical beams to a surface of the silicon substrate to form a silicon oxide layer on the silicon substrate. Both oxygen and hydrogen are irradiated as radical beams to a silicon substrate to produce radical water molecules on the surface of the silicon substrate. Accordingly silicon oxide layers of high purity can be formed at low temperatures on silicon substrates without damaging the silicon substrates.

15 Claims, 11 Drawing Sheets

APPARATUS FOR FABRICATING SEMICONDUCTOR DEVICES

This application is a continuation of application Ser. No. 08/113,684, filed on Aug. 31, 1993 now abandoned.

BACKGROUND OF THE INVENTION

The present invention relates to a beam generating apparatus for use in an apparatus for fabricating semiconductor devices for surface-treating substrates in vacuum chambers and forming layers on the substrates, and to a method for fabricating semiconductor devices using the apparatus for fabricating semiconductor devices.

In the beam generating apparatus, gas is introduced into the vacuum chamber, and the gas is heated thereby to be cracked to emit molecular beams, or the gas is plasmatized thereby to be activated to emit activated beams.

In semiconductor fabricating techniques, activated beams from the beam generating apparatuses are used to clean or etch the surfaces of semiconductor substrates, or form semiconductor layers and dielectric layers on semiconductor substrates of high quality. Accordingly in an apparatus for fabricating semiconductor devices the beam generating apparatus does a most important role which influences properties of fabricated semiconductor devices.

The beam generating apparatus is provided in the high-vacuum chamber. Accordingly vacuum sealing of the beam generating apparatus is one of the most important problems.

Generally it is difficult to vacuum seal two members which are exposed to high temperatures above 1000° C. This is because limited materials are heat-resistant and come out little gas. For example, insulators, such as quartz, alumina, PBN (pyrolitic boron nitride), sapphire, etc., metals of high melting points, such as tantalum (Ta), molybdenum (Mo), tungsten (W), etc., and semiconductors, such as carbon (C), silicon carbide (SIC), etc., have such properties.

On the other hand, a stainless steel tube, as of SUS316L or others, is used for the introduction of gas into the vacuum chamber. Most of the above-mentioned materials cannot be welded with stainless steel. Even if they can be welded to stainless steel, members integrated by welding make the maintenance of the apparatus very difficult.

Means of providing seal rings between the two materials for the vacuum sealing is not suitable to seal the materials which are exposed to high temperatures because no sealing ring materials have heat resistance to about 1000° C.

For the above-described reason, the conventional beam generating apparatus uses the vacuum sealing method of FIG. 1. This conventional beam generating apparatus is used as a radical/atomic beam source (a beam source in which gas is cracked by heating or activated by plasmatizing to generate activated beams), or a gas cell (gas source using MBE (molecular beam epitaxy) apparatus).

The conventional beam generating apparatus is mounted on a wall 48 of a vacuum chamber. On the wall 48 there is mounted a base flange 47 which is a base of the beam generating apparatus. A gas feed pipe 41 is attached to the base flange 47 for introducing gas. The gas feed pipe 41, and a beam generating cell 43 (which functions as a discharge tube in a beam generating apparatus for generating radical/atomic beams, and functions as a cracker to be heated by a heater in a beam generating apparatus for generating molecular beams) are interconnected by a heat resistance pipe 42 of quartz, alumina, PBN, Ta or others. An aperture plate 44 is provided in the beam generating cell 43. The aperture plate 44 has an aperture 49 for passing the activated beams. The aperture plate 44 is provided in the beam generating cell 43 by an aperture plate aligner 46 mounted on a support base 45.

In the conventional beam generating apparatus, as shown in FIG. 1, the gas feed pipe 41 and the heat resistant pipe 42 are vacuum-sealed by inserting one in the other (matching on their tapered surfaces) with their matching machining precision, and the heat resistant pipe 42 and the beam generating cell 43 are vacuum sealed by a pressure resulting from their matching machining precision. The beam generating cell 43 and the aperture plate 44 are vacuum sealed by pressing each other by the aperture plate aligner 46 screwed on the support base 45.

Another problem with the beam generating apparatus is a method of heating the beam generating cell. In the conventional beam generating apparatus, to heat a gas cell used in a gas source MBE, a Ta heater (not shown) is provided around the outer circumference of the cell so as to heat the gas cell by radiation of the Ta heater.

But the above-described vacuum seals have the following problems.

Firstly, the seals by the above-described insertion and pressure have poor air-tightness. In generating either of atomic beams and molecular beams, higher gas pressure is preferred to enhance the decomposition efficiency. But at high gas pressures, fed-in gas leaks at the vacuum seals, with a result that ratios of atoms or radicals which arrive at semiconductor substrates located in the vacuum chamber lowers, and reaction efficiency lowers.

Secondly, when the beam generating cell has high temperatures, thermal distortion of the constituent members further lowers the air tightness, and sometimes the constituent members are damaged.

The above-described heating method of the beam generating cell has the following problems.

Firstly, gas involved in the growth reacts with Ta of high temperature, with a result that the Ta heater tends to have wire breakages.

Secondly a heat capacity including that of the beam generating cell is generally so large that it is difficult to quickly response to raised and lowered temperatures.

Thirdly, since members near the heater have high temperatures, gasses come out from these members cause contamination.

Fourthly, generally the heating by radiation of a heater requires a heater support, a radiation shield, water-cooling pipes, etc., which make the structure complicated.

On the other hand, it is very important to semiconductor device fabricating techniques to form oxide layers of high quality on semiconductor surfaces.

Semiconductor oxide layers, e.g., silicon (Si) oxide layers, are used as gate oxide layers, inter-layer insulating layers, inter-device separation insulating layers of MOSs (metal-oxide-semiconductors) field-effect transistors.

The gate oxide layers are required being as thin as some nanometers to tens nanometers as MOS field-effect transistors are down-scaled. As the device is down-scaled, to suppress diffusion of undesired impurities, lower-temperature processes are important.

Under these circumstances, it is expected that a technique which can form at low temperatures semiconductor oxide layers having few interface traps, high dielectric strength, and high quality.

Conventionally the gate oxide layer of a MOS field-effect transistor is formed usually by thermal oxidation. The oxidation method includes dry oxidation containing no water in ambient atmosphere, and wet oxidation containing water in ambient atmosphere.

In these thermal oxidation methods, silicon substrates are positioned in a furnace core pipe of quartz, and the substrates are heated up to about 1000° C. in acid ambient atmosphere of oxygen, water vapor, etc. to form oxide layers on the surfaces of the substrates. It is known that acid ambient atmosphere containing water vapor enhances oxidation speeds.

As semiconductor devices are down-scaled, for the prevention of changes of formed impurities distributions and crystallinities of semiconductors, the low-temperature fabrication of semiconductor devices are required.

The temperature reduction has been tried on the thermal oxidation. Even in high-pressure oxidation, unless silicon substrate are heated up to above 700° C., oxide layers of required characteristics cannot be formed, and the oxide layers cannot be dense.

This will be because, although oxidizing materials diffuse in the oxide layers and associate with silicon atoms in the interfaces of the oxide layers, sufficient energy for the oxidation is not given.

For this reason, the following methods are necessary to form silicon oxide layers. A first method is for depositing a silicon oxide layer on a silicon substrate. A second method is for using oxidizing materials which sufficiently oxidize silicon even at low temperatures.

In the first method, the deposition of a silicon oxide layer can be conducted by CVD or sputtering but find it difficult to remove impurities in the interface of the oxide layer, and to form a dense oxide layers. Accordingly it is so far difficult to use this method for forming gate oxide layers of MOS transistors.

In the second method, in which an oxidizing material which sufficiently oxidizes silicon at even low temperatures is used, it can be proposed to add a catalyst for accelerating oxidation of the oxidizing material. But this method has a risk of adding undesired impurities. To overcome these problems, low-temperature oxidation using activation materials, such as oxygen plasma, anodic oxidation in plasma, oxygen radicals by UV radiation, etc., are being studied.

But high energy particles, such as ions and electrons generated in plasma, UV rays, soft X-rays, damage oxide layers, which results in deviations of a threshold voltage of MOS transistors, increases of leak currents, and decreases of switching speeds, etc. A method which uses oxygen radicals by UV radiation is prospective as a method which less damages oxide layers unless the UV radiation is directly applied to the substrates, but has a problem in terms of efficiency.

Thus methods for forming silicon oxide layers of high quality at low temperatures are still insufficient.

SUMMARY OF THE INVENTION

An object of the present invention is to provide an apparatus for fabricating semiconductor devices comprising a beam generating cell which has little gas leakage at vacuum seals.

Another object of the present invention is to provide a method for fabricating a semiconductor device which can form silicon oxide layers of high quality at low temperatures.

The above-described objects are achieved by a beam generating apparatus disposed in a vacuum processing chamber for processing a substrate, for emitting activated beams into the processing chamber, the beam generating apparatus comprising: a beam generating cell for generating the activated beams, the beam generating cell having a speculum contact surface; a gas introduction member for introducing gas into the beam generating cell, the gas introduction member having a speculum contact surface; a bellows members connected to the gas introduction member, for pressing the contact surface of the gas introduction member against the contact surface of the beam generating cell so as to vacuum-seal a contact between the beam generating cell and the gas introduction member.

The above-described objects are achieved by an apparatus for fabricating semiconductor devices comprising: a vacuum processing chamber for processing a substrate; a first beam generating apparatus described above disposed in the processing chamber, for emitting hydrogen plasma beams; and a second beam generating apparatus described above disposed in the processing chamber, for emitting oxygen plasma beams.

The above-described objects are achieved by an apparatus for fabricating semiconductor devices comprising: a crystal growing unit with a growing chamber for growing a semiconductor layer on a substrate; a processing chamber for processing the substrate, the processing chamber being connected to the growing chamber of the crystal growing unit through a gate valve; a first beam generating apparatus described above disposed in the processing chamber, for emitting hydrogen plasma beams; and a second beam generating apparatus described above disposed in the processing chamber, for emitting oxygen plasma beams.

The above-described objects are achieved by a method for fabricating a semiconductor device comprising the steps of: heating a silicon substrate to a temperature below 700° C.; and irradiating neutral oxygen radical beams and hydrogen radical beams to a surface of the silicon substrate to form a silicon oxide layer on the silicon substrate.

According to the present invention, the speculum surface of the beam generating cell whose temperature becomes high, and the speculum surface of the gas introduction member are contacted with each other, and the resiliency of the bellows connected to the gas introduction member to apply a pressure to the contact therebetween. This contact does not resort to the conventional tapered surfaces, and accordingly high machining precision is not required. At this contact both members are pressed against each other by the resiliency of the bellows, and accordingly higher air-tightness can be provided.

Influences by thermal distortion can be absorbed by the contact and the bellows, and accordingly the air-tightness is never deteriorated at high temperatures. Needless to say, the gas introduction member and beam generating cell are never damaged.

According to the present invention, the beam generating cell is heated by high frequency heating, and increases and decreases of temperatures can be quickly responded to. Accordingly beams can be controlled based on temperatures of the beam generating cell.

In heating by Ta heaters, processing specimens are contaminated by gasses emitted from higher temperature portions of the members near the heater, but according to the present invention such contamination never takes place, and processing specimens of high purity can be prepared.

According to the present invention, at least one of oxygen and hydrogen is irradiated as radical beams to a silicon substrate to produce radical water molecules on the surface of the silicon substrate. Because of water molecules, accelerated oxidation takes place as in wet oxidation. Since the water molecules are radicals, the molecules diffuse throughout an oxide layer, and when they associate with silicon atoms, sufficient oxidation can occurs. Accordingly silicon oxide layers of high purity can be formed at low temperatures on silicon substrates without damaging the silicon substrates.

DETAILED DESCRIPTION OF THE INVENTION

Figure 1:
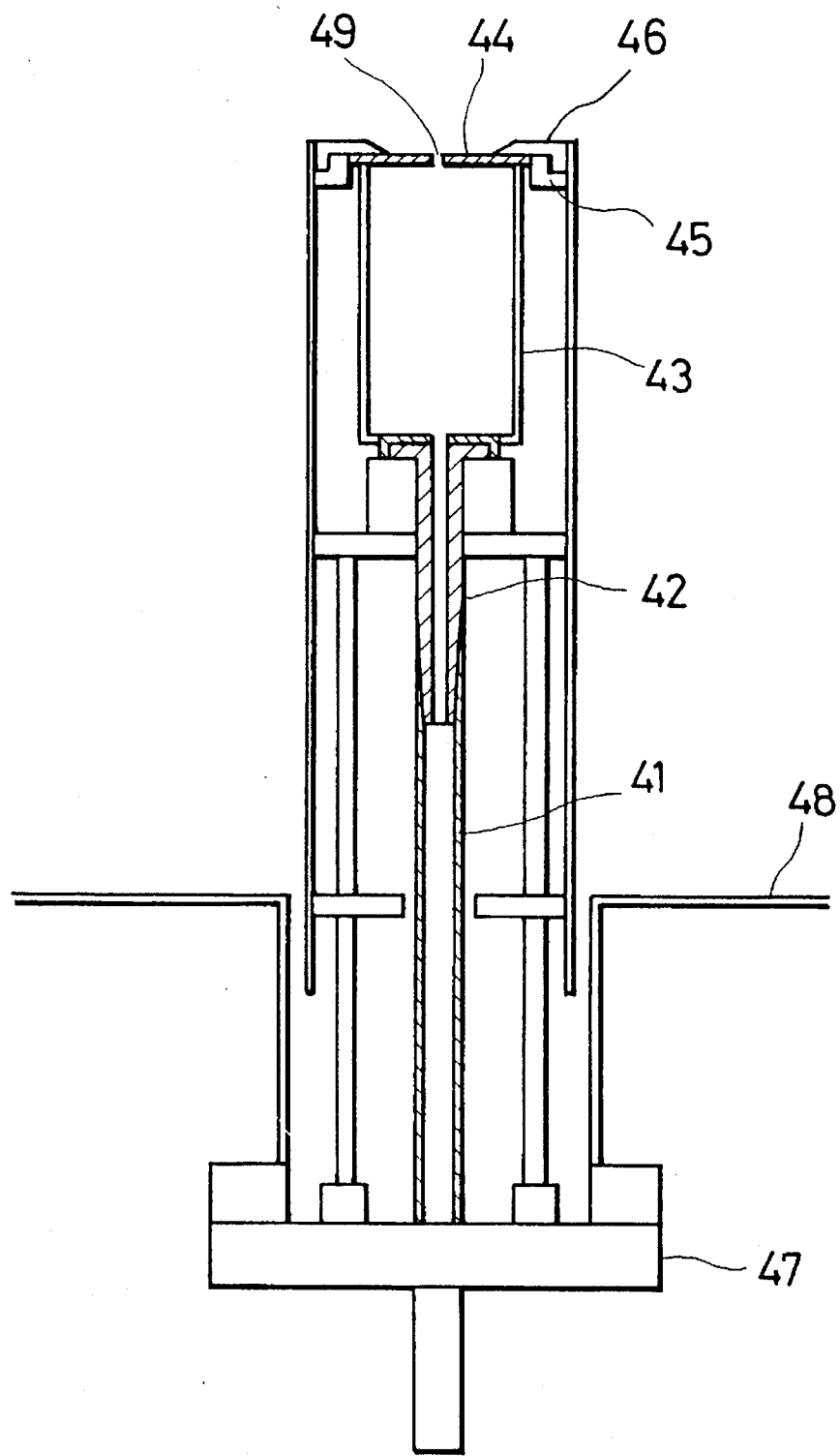
FIG. 1 is a view of the conventional beam generating apparatus.
Figure 2:
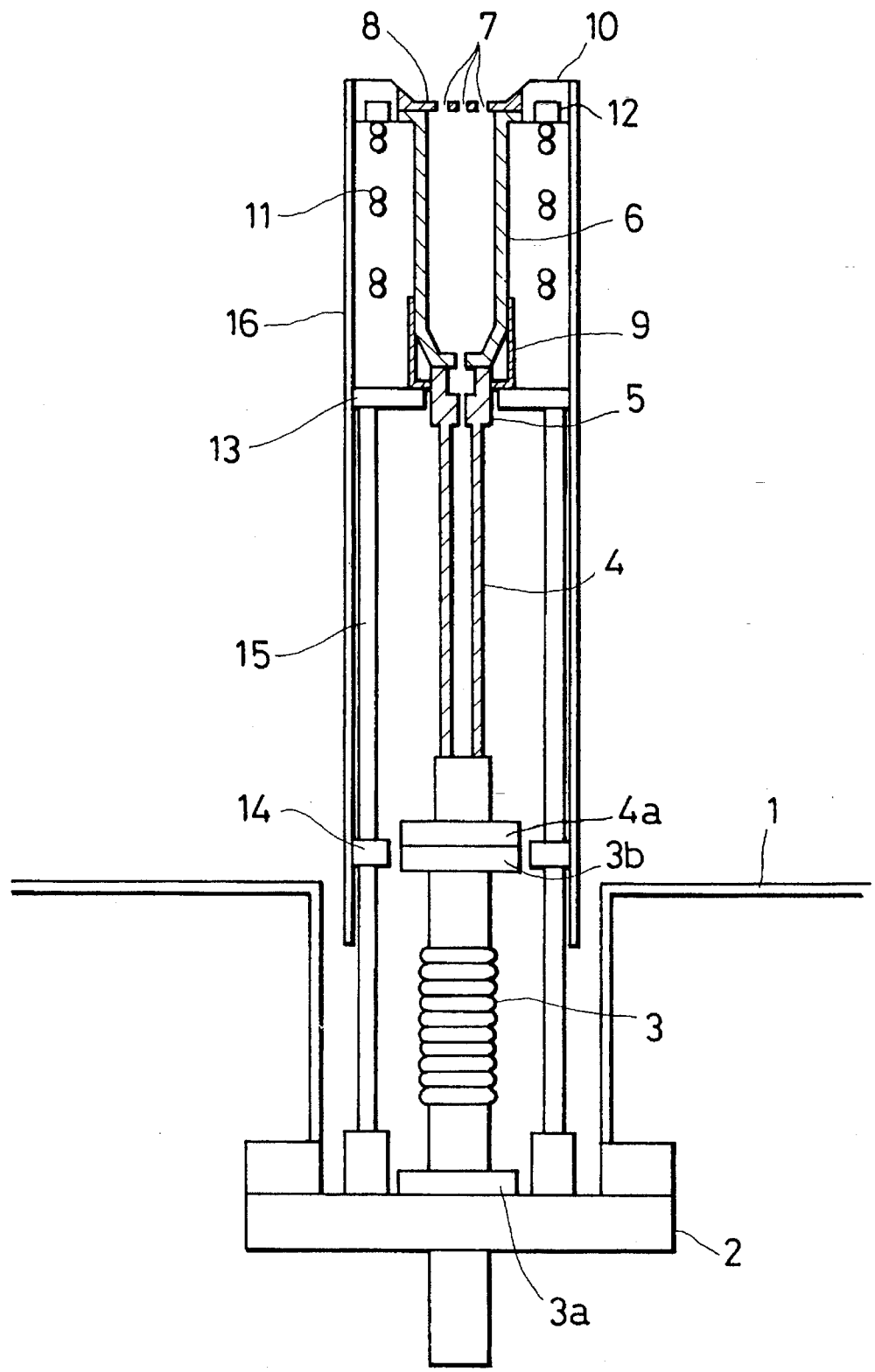
FIG. 2 is a view of the beam generating apparatus according to a first embodiment of the present invention.

The beam generating apparatus according to a first embodiment of the present invention will be explained with reference to FIGS. 2 to 4.

The beam generating apparatus according to the first embodiment is disposed in a vacuum chamber of an apparatus for fabricating semiconductor devices and generate radical/atomic beams into a reactor. The vacuum chamber is evacuated by an exhaust pump (not shown) to be retained at a vacuum degree of about $10^{-10}$ torr.

The beam generating apparatus is mounted on a wall of the vacuum chamber of the apparatus for fabricating semiconductor devices. On the wall 1 there is provided an ICF base flange 2 of a 152 mm-diameter as the base of the beam generating apparatus. The base flange 2 has an extensible bellows 3. On both sides of the bellows 3, ICF flanges 3a, 3b of a 34 mm-diameter are provided.

A quartz pipe 4 for feeding gas is provided on the top of the bellows 3. The lower end of the quartz tube 4 is sealed with Pyrex glass, covar glass and a covar alloy, and welded to an ICF flange 4a of a 34 mm-diameter. A quartz spacer 5 is melt bonded to the upper end of the quartz pipe 4.

A discharge tube 6 of PBN is provided on the upper end of the quartz spacer 5. The discharge tube 6 is guided into position by a guide ring 9 of PBN provided around the outer circumference of the quartz spacer 5.

On the upper end of the discharge tube 6 there is provided an aperture plate 8 of PBN. The aperture plate 8 has, e.g., three apertures 7 of a 0.1 mm-diameter. The aperture plate 8 is pressed against the discharge tube 6 by an aperture plate aligner 10 of Mo.

Around the outer circumference of the discharge tube 6 there is provided an RF coil 11 of oxygen-free copper for cooling water to be circulated through. The RF coil 11 is welded to a ring 12 of oxygen-free copper. The ring 12 is buried in the aperture plate aligner 10.

The guide ring 9 is supported by a base 13 of alumina. The base 13 is interconnected to a base 14 of Mo by a support 15 of Mo. A Ta sealed cylinder 16 is provided to cover the entire beam generating apparatus.

The base 13 and the base 14 are screwed to the support 15. The sealed cylinder 16 is screwed to the base 14. The ring 12 is screwed to the aperture plate aligner 10.

When the sealed cylinder 16 is screwed to the base 14 with the bellows 3 compressed, a restoring force of the bellows 3 causes the aperture plate aligner 10 to press the aperture plate 8 and the discharge tube 6 against the quartz spacer 5.

In the beam generating apparatus according to the first embodiment, surfaces of the aperture plate 8 and of the discharge tube 6 at their contact with each other, and surfaces of the discharge tube 6 and of the quartz spacer 5 at their contact with each other are polished in specula so as to ensure vacuum seal when they are respectively pressed on each other. That is, the surfaces polished specular are pressed on each other to establish vacuum seal. A collar is provided on the surface of the discharge tube 6 on the side of the aperture plate 8 for an increase contact area between the discharge tube 6 and the aperture plate 8.

According to the present embodiment, a leakage amount of fed gas at these contacts is sufficiently small in comparison with an ejection amount of the gas through the apertures 7. Sufficient vacuum seal can be realized.

The beam generating apparatus according to the present embodiment covers the following variations.

In the present embodiment, the bellows 3 and the quartz tube 4 are separately provided and interconnected by the flanges 3a, 4a, but the bellows and the quartz tube 4 may be integrated by melt bonding.

In the present embodiment, the discharge tube 6 and the aperture plate 8 are formed of PBN, but may be formed of quartz, alumina or sapphire in place of PBN.

In the present embodiment, the tube 4 and the spacer 5 are formed of quartz, but may be formed of alumina or sapphire.

In the present embodiment, the bellows 3 and the quartz tube 4 are connected for the sealing by the ICF flange, but may be connected for vacuum sealing by other means.

Then, the operational procedure of an apparatus for fabricating semiconductor devices including the beam generating apparatus according to the first embodiment will be explained.

First, hydrogen gas, for example, as a source gas is introduced into the discharge tube 6 through the bellows 3, the quartz tube 4 and the quartz spacer 5. When a pressure in the discharge tube 6 is tens mtorr to hundreds mtorr, electric power is supplied to the RF coil 11 by an RF power supply (not shown), and glow discharges are generated.

Subsequently as the electric power is gradually increased, the plasma is pinched, and arc discharge is generated. A number of radical atoms are generated. The generated radical atoms are ejected into the vacuum chamber as atomic radial beams through the apertures 7 in the aperture plate 8.

The discharge tube 6 has a temperature of 1000° to 2000° C. when radicals are generated, but the neighborhood of the aperture plate 8 is effective cooled by the circulating water in the RF coil 11 since the ring 12 welded to the RF coil 11 is buried in the aperture plate aligner 10.

Next, the stability of the electric discharge by the beam generating apparatus according to the first embodiment will be explained with reference to FIG. 3.

In the beam generating apparatus according to the first embodiment, as described above, electric discharges are made into the discharge tube 6 at a gas pressure of $10^{-2}$ to 1 torr to generate plasma, and radical/atomic beams are emitted in beams into the vacuum chamber of a $10^{-6}$ to $10^{-8}$ torr. The plasma in the discharge tube 6 changes its condition very sensitively depending on gas pressures in the discharge tube 6. Accordingly vacuum sealing means in the beam generating apparatus is important.

Figure 3:
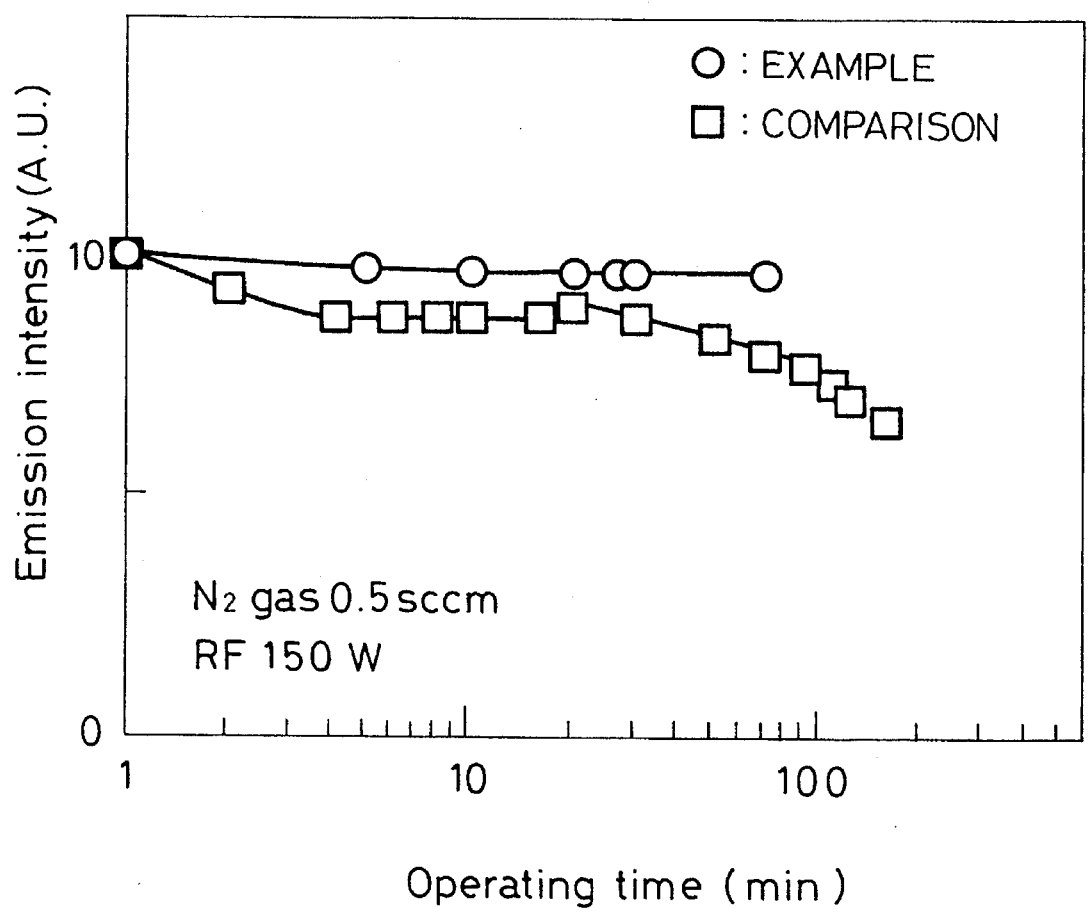
FIG. 3 is a graph of discharge stability in the beam generating apparatus of FIG. 2.

FIG. 3 is a graph of transient changes of emission intensities in the vacuum tube. Example shows the case in which the vacuum sealing method used in the first embodiment is used. Comparison shows the case in which the vacuum sealing used in the first embodiment is not used.

In the comparison example which does not use the vacuum sealing method of the first embodiment, as shown in FIG. 3, the members around the discharge tube 6 were heated up to a high temperature of 500° to 1500° C. by discharges of plasma in high luminance modes. Larger amounts of gas leakage took place due to thermal distortions, with results that the gas pressure in the discharge tube 6 lowered, and the emission intensity of the plasma transiently lowered.

But in the example, as shown in FIG. 3, no gas leakage took place due to thermal distortion, and the emission intensity of the plasma was retained constant without lowering.

Then purity of the plasma generated by the beam generating apparatus according to the present embodiment will be explained with reference to FIG. 4.

Figure 4:
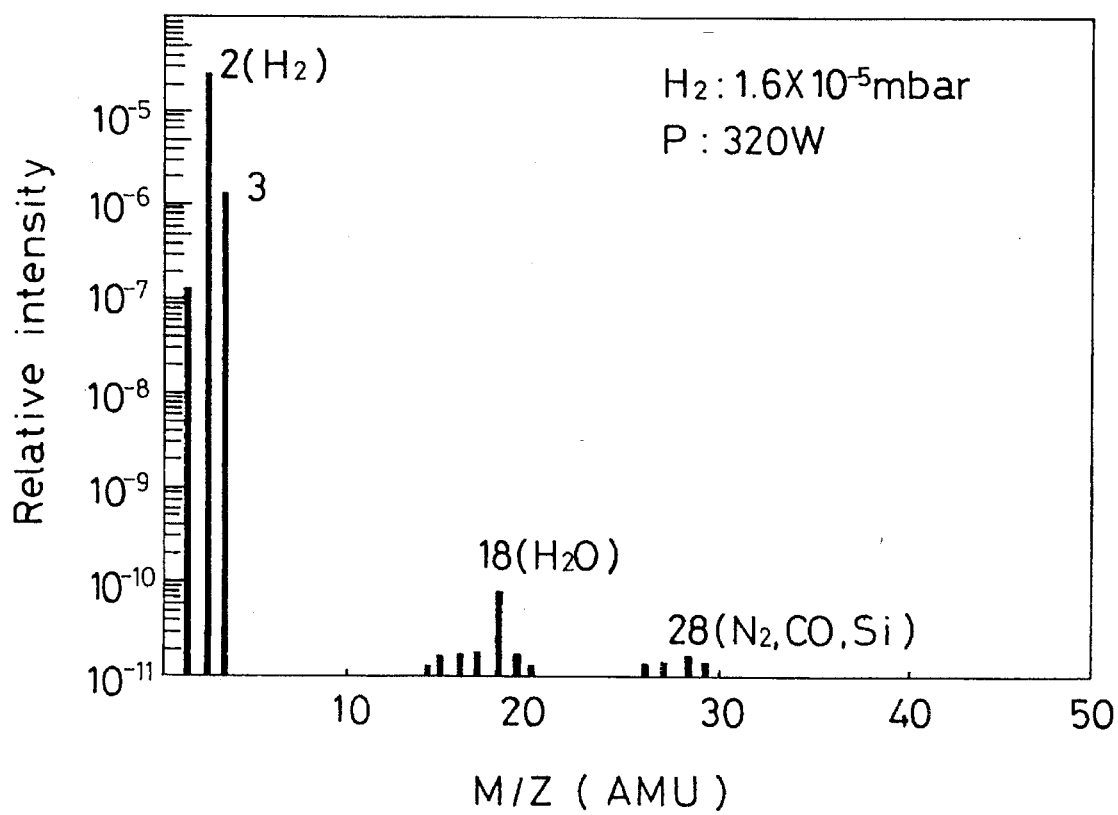
FIG. 4 is a graph of the purity of plasma in the beam generating apparatus of FIG. 2, FIG. 5 a view of the beam generating apparatus according to a second embodiment of the present invention.

FIG. 4 shows measured results of residual gas in the vacuum chamber by a quadrupole spectrometer in the case that hydrogen plasma was generated in the beam generating apparatus according to the first embodiment. The quadrupole spectrometer was positioned in the vacuum chamber.

A vacuum degree of the vacuum chamber before gas introduction was about $4 \times 10^{-11}$ mbar. A vacuum degree of the vacuum chamber after hydrogen gas was introduced was $1.6 \times 10^{-5}$ mbar. An electric power supplied to the RF coil 11 was 320 W.

A major impurity in the vacuum chamber was $H_2O$ (M/Z=18). A partial pressure was $1-3 \times 10^{-10}$ (relative intensity), which was lower by even 5 places than a partial pressure $2 \times 10^{-5}$ (relative intensity) of $H_2$ (M/Z=2).

A partial pressure of $H_2O$ in the case that no plasma was generated was about $5 \times 10^{-12}$ (relative intensity) before hydrogen gas introduction, and after the hydrogen gas introduction, the partial pressure was about $5 \times 10^{-11}$ (relative intensity).

A reason for the partial pressure value measured when plasma generated is higher than these partial pressures is as follows. It is known that when mass spectroscopy is conducted in an ambient atmosphere of hydrogen there occurs the phenomena that water increases around the filament. It is considered that the measured values given when the plasma was generated were influenced by this phenomenon. In the case that nitrogen plasma was generated, no increases in a $H_2O$ partial pressure was measured.

Thus, the use of the beam generating apparatus according to the first embodiment permits high-temperature resistant materials to be used as materials of the members around the discharge tube. Accordingly out-gas generated during the generation of plasma can be decreased.

Figure 5:
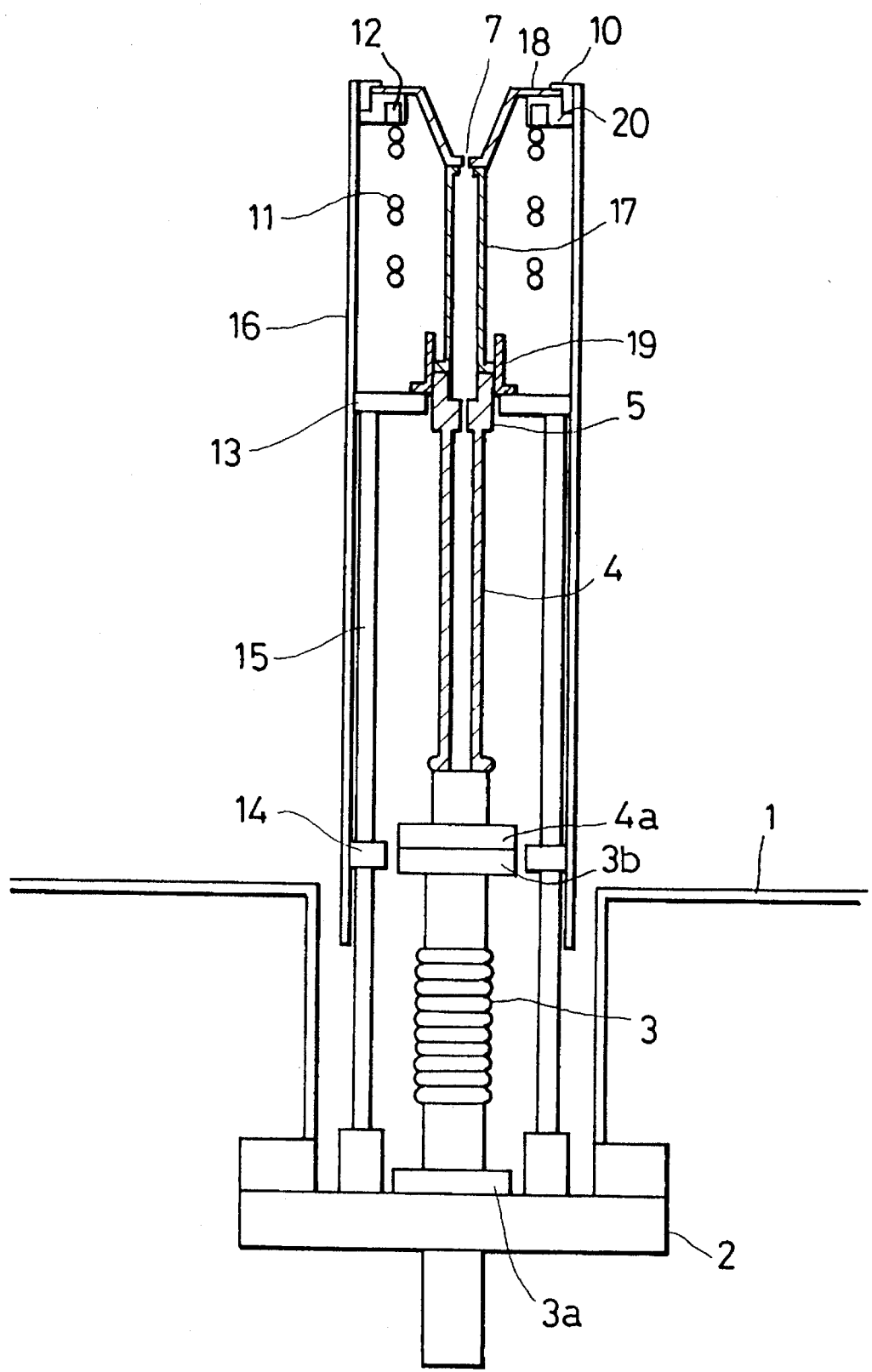

The beam generating apparatus according to a second embodiment of the present invention will be explained with reference to FIG. 5. The beam generating apparatus of FIG. 5 is installed in a gas source MBE apparatus. Common members of the second embodiment with the first embodiment have the same reference numerals as corresponding ones of the latter not to repeat their explanation.

The beam generating apparatus according to the second embodiment is used in, e.g., a gas source MBE apparatus to generate molecular beams.

A cracker tube 17 of graphite is disposed on a quartz spacer 5 on a quartz pipe 4. The cracker tube 7 is guided into position by a guide ring 9 of graphite disposed around the quartz spacer 5.

On the upper end of the cracker pipe 17 there is provided an aperture plate 18 of graphite. An aperture is formed in the aperture plate 18. The aperture plate 8 is pressed against the cracker tube 17 by an aperture plate aligner 10 of Mo. The aperture plate aligner 10 is supported by a support ring 20 of alumina.

Around the cracker tube 17 there is provided an RF coil 11 of oxygen-free copper for circulating cooling water. The RF coil 11 is welded to a ring 12 of oxygen-free copper. The ring 12 is buried in a support ring 20.

In the beam generating apparatus according to the first embodiment, surfaces of the aperture plate 18 and of the cracker tube 17 at their contact with each other, and surfaces of the cracker tube 17 and of the spacer 5 at their contact with each other are polished in specula so as to ensure vacuum seal when they are respectively pressed on each other. That is, the surfaces polished specular are pressed on each other to establish vacuum seal.

The beam generating apparatus according to the second embodiment covers the following modifications.

In the second embodiment, the cracker tube 17 and the aperture plate 18 are formed of graphite. But they may be formed of a conductor, such as Ta, Mo, W, SiC or others, or an insulator, such as quartz, PBN, alumina, sapphire or others, and further have the surfaces coated with graphite or SiC. Especially the cracker pipe 17 and the aperture plate 18 formed of Ta are expected to provide improved efficiency of decomposing gasses by its catalytic action.

In the second embodiment the pipe 4 and the spacer 5 are formed of quartz, but may be formed of a conductor, such as Ta, Mo, W, SiC or others.

The operational procedure of the apparatus for fabricating semiconductor devices including the beam generating apparatus according to the second embodiment will be explained.

A source gas is introduced into the cracker tube 17 through a bellows 3, the quartz pipe 4 and the quartz spacer 5.

As a source gas, phosphine ($PH_3$) or arsine ($AH_3$) is used in the case that a III-V compound semiconductor is to be deposited, monosilane ($SiH_4$) or monogermane ($GeH_4$) is used in the case that a IV semiconductor is to be deposited, and hydrogen sulfide ($H_2S$) or selenium sulfide ($H_2Se$) is used in the case that a II-VI compound semiconductor is to be deposited.

The cracker pipe 17 is radio-frequency heated by the RF coil 11 up to about 1000° C. A pressure in the cracker tube 17 is retained at some mtorrs to some torrs. The source gas in the cracker tube 17 is cracked thereby to emit molecular beams.

Next, the low-temperature oxide layer forming apparatus according to a third embodiment of the present invention will be explained with reference to FIGS. 6 to 9. In the low-temperature oxide layer forming apparatus according to the third embodiment, as a hydrogen radical source and an oxygen radical source, the beam generating apparatus according to the first embodiment is used.

Recently plasma sources for generating high-temperature non-equilibrium plasma which is positioned between glow discharge plasma and thermo-plasma are developed (e.g., "Shinkuu", vol. 31, No. 4, 1988. p. 19).

Glow discharge plasma is generated in the RF discharge tube, and as an applied RF electric power is further increased, the plasma is abruptly pinched at a certain point and emit intense light. In this state, it is considered that the RF coil corresponds to a primary coil of a transformer, and the plasma corresponds to a secondary coil of the short-circuited transformer. Such plasma is generated between about 10 Pa and 1000 Pa, has an electron temperature higher than a gas temperature, and has a thermally non-equilibrium state.

Figure 6:
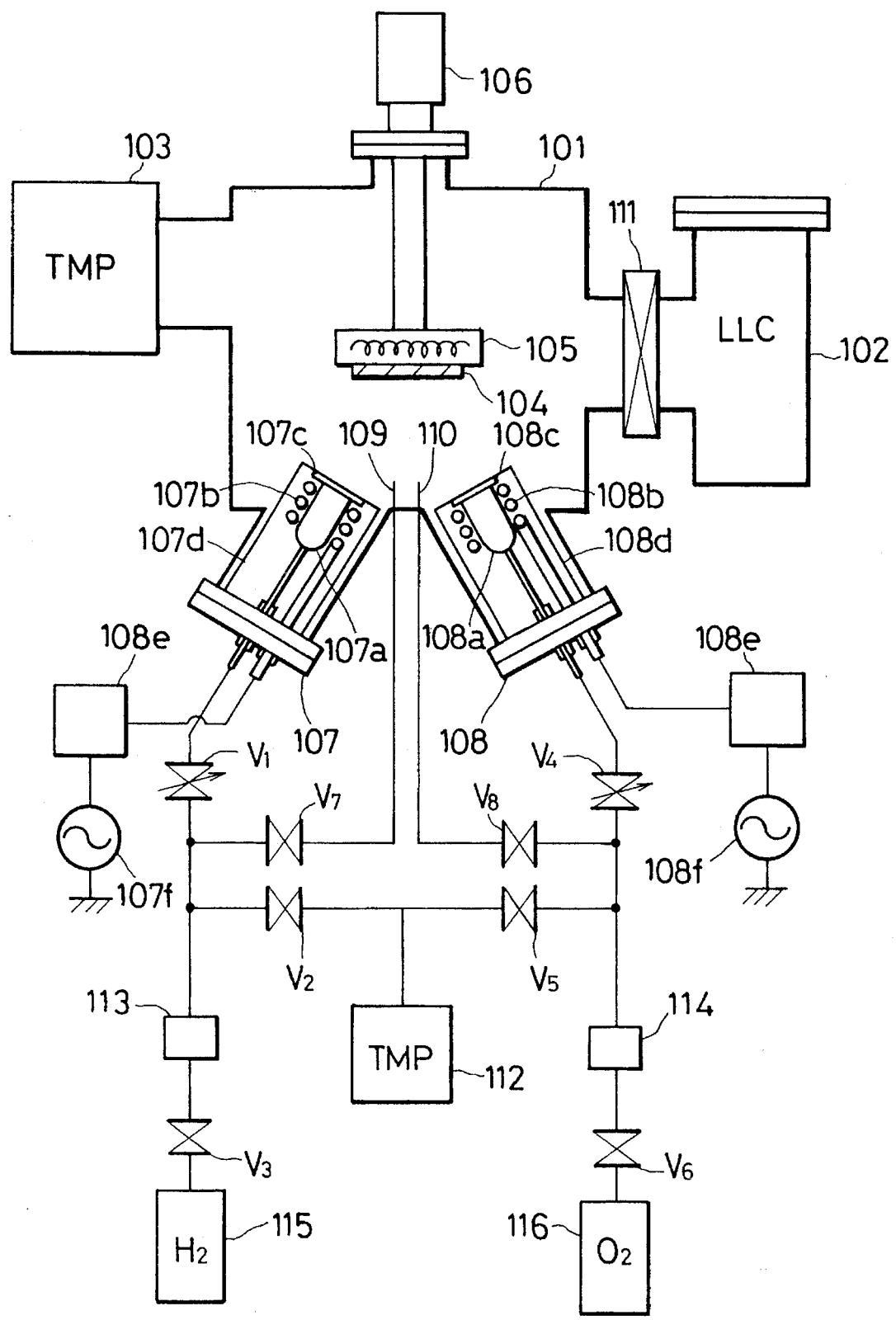
FIG. 6 is a view of the low-temperature oxide layer forming apparatus according to a third embodiment of the present invention.

FIG. 6 shows a diagrammatic sectional view of the low-temperature oxide layer forming apparatus using such plasma source.

An air-tight processing chamber 101 is connected to a high pumping speed turbo-moleculer pump 103 and is a vacuum chamber which can be evacuated to an ultimate vacuum degree of $10^{-10}$ torr. The vacuum chamber 101 is connected through a gate valve 111 to a load lock chamber 102 for loading and unloading a silicon substrate.

In the processing chamber 101 there are provided a substrate holder 105 connected to a manipulator 106. A heater is provided in the substrate holder 105 so as to heat the substrate at a required temperature.

The processing chamber 101 is connected to a hydrogen radical source 107 for generating hydrogen radicals, and an oxygen radical source 108 for generating oxygen radicals. The hydrogen radical source 107 is used to generate hydrogen radicals for cleaning the substrate 104 mounted on the substrate holder 105 and to produce water molecules. The oxygen radical source 108 is used to generate oxygen radical for producing water molecules on the substrate.

The hydrogen radical source 107 and the oxygen radical source 108 each include a discharge tube 107a, 108a, an RF coil 107b, 108b, an aperture member 107c, 108b which enables differential pumping and has an aperture for passing radical beams, and a shield cylinder 107d, 108d for covering the members 107a, 107b, 107c; 108a, 108b, 108c.

This arrangement enables plasma to be generated with the interior of the processing chamber 101 at high vacuum and with the interiors of the discharge pipes 107a, 108a retained at relatively low vacuum.

The hydrogen radical source 107 and the oxygen radical source 108 are connected respectively to pipings for feeding hydrogen from a hydrogen cylinder 15, and a pipe for feeding oxygen from an oxygen cylinder 116, and also respectively to matching circuits 107c, 108c for supplying RF electric power respectively from RF power sources 107f, 108f.

In the pipings interconnecting the hydrogen cylinder 115 and the oxygen cylinder 116 and the radical sources 107, 108 there are respectively inserted main valves V3, V6, low pressure valves 113, 114, and variable leak valves V1, V4.

The pipings after the low pressure valves 113, 114 are respectively connected also to a hydrogen gas nozzle 109 and to an oxygen gas nozzle 110. These gas nozzles can feed gas directly into the processing chamber 101 without passing through the radical sources.

The pipings after the low pressure valves 113, 114 are connected also to a turbo-molecular pump through valves V2, V5. The interior of the pipings can be evacuated into high vacuum by the turbo-molecular pump. Although not shown, the load lock chamber is also connected to the turbo-molecular pump, so that the load lock chamber can be evacuated into high vacuum.

First the step of mounting on a silicon substrate on the substrate holder 105, and cleaning the substrate by using the hydrogen radical source 107 will be explained.

Chemically cleaned a silicon substrate are loaded into the load lock chamber 102, and the load lock chamber 102 is evacuated by the turbo-molecular pump (now shown). When the load lock chamber has been evacuated down to a vacuum degree of about $10^{-8}$ torr, the gate valve 11 is opened, and the silicon substrate are mounted onto the substrate holder 105 by a substrate carrying mechanism (not shown). Then the silicon substrate are gradually heated up to a temperature of 550°–600° C. by the heater in the substrate holder 105 and retained at the temperature.

The gas feeding lines of the radical sources and the interior of the discharge tube have been beforehand sufficiently evacuated by the turbo-molecular pump 112, and the variable leak valves V1, V4 are closed. The valves V2, V5 are opened to keep the interiors of the pipings in high vacuum.

Then the main valve V3 of the hydrogen cylinder 115 to cause hydrogen gas to flow from the low pressure valve 113 to the gas line. When a flow rate through the gas line has become stable, the variable leak valve V1 is opened, the valve V2 being closed to feed hydrogen into the discharge tube.

When a pressure in the discharge tube becomes tens mtorrs to hundred mtorrs, an RF power is supplied to the RF coil 107b from the RF power supply 107f through the matching circuit 107e. By the supply of the RF electric power, glow discharges take place in the discharge tube 107a.

A pressure in the discharge tube can be estimated based on a vacuum degree in the processing chamber 101, a pumping speed of the pump, and a conductance of the aperture of the aperture member 107c. Actually, based on conditions set in the preparatory step, a vacuum degree in the interior of the processing chamber 101 is adjusted by the variable leak valve V1.

In an example, the discharge tube 107a had a 30 mm-diameter, and the aperture member 107c had three 0.2 mm-diameter apertures. In this arrangement, hydrogen was introduced so that the processing chamber had a vacuum degree of $10^{-7}$ torr.

When an RF power of 170 W was supplied, glow discharge was generated. When the RF power was further increased up to 250 W, the plasma was abruptly pinched and emitted intense light in arc discharge. When the plasma is once pinched, the pinch of the plasma is maintained even when the power is decreased. Accordingly the plasma can be stably operated at an RF power of 250 W.

Radical beams were emitted outward from the pinched plasma. UV rays could not be shielded, but a diameter of the apertures were sufficiently small to make a light quantity sufficiently small.

The manipulator 106 was operated to rotate the substrate, and a substrate shutter (not shown) was opened. Then hydrogen radicals irradiated the surfaces of the substrate 104. High energy particles were less irradiated, and only hydrogen radicals were predominantly irradiated onto the substrate surface. Accordingly the silicon substrate surface was not damaged, but could have a natural oxide layer, oxygen, metals, etc. removed.

While hydrogen radicals are being irradiated, gas in the processing chamber 101 was analyzed by a four moment mass spectrometer. It was found that SiH, $SiH_2$ and $SiH_3$ were observed, and Si was a little etched. After 20 minutes the substrate shutter was closed, and the cleaning of the substrate surface was finished.

Subsequently a silicon oxide layer was formed on the surface of the silicon substrate 104. The silicon oxide layer was formed by three methods.

Figure 7A:
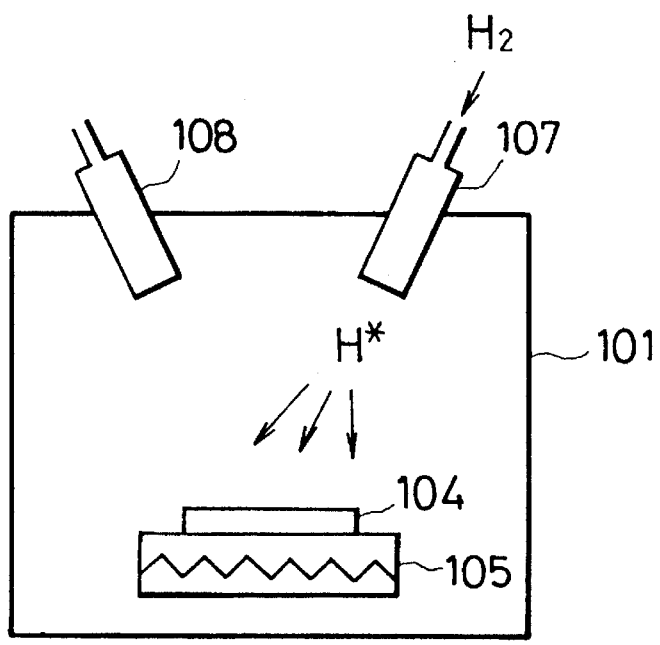
FIGS. 7A and 7B are explanatory views of a first example of a silicon oxide layer forming method using the low-temperature oxide layer forming apparatus of FIG. 6.
Figure 7B:
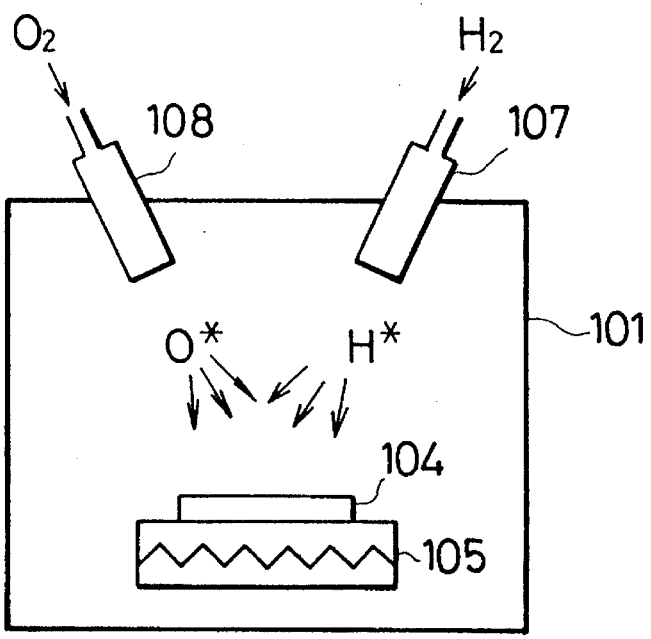

FIG. 7 is a diagrammatic sectional view explaining the formation of a silicon oxide layer according to a first example. FIG. 7A shows the step of cleaning the silicon substrate surface by the hydrogen radical beams described above. FIG. 7B shows the step of forming silicon oxide layer following the surface cleaning step following the surface cleaning step.

The oxygen radical source 108 was driven in the same procedure as in the generation of hydrogen radical beams. In the case of oxygen, glow discharge is generated at an RF power of about 150 W. At an about 220 W-RF power plasma is pinched. Oxygen radicals are emitted from the pinched plasma.

The substrate shutter (not shown) was opened with radical beams generated, and the neutral hydrogen radical beams and the neutral oxygen radical beams were concurrently irradiated for about 30 minutes onto the silicon substrate 104. It is considered that the hydrogen radicals include H* and $H_2$*, and the oxygen radicals include O* and $O_2$*.

After the hydrogen radicals and the oxygen radicals were concurrently irradiated, the silicon substrate was taken out by the load lock chamber 102. A layer thickness of the silicon oxide layer on the silicon substrate was measured by ellipsometry. It was confirmed that a 45 nm-thickness silicon oxide layer was formed.

For comparison example, only oxygen radicals were irradiated on the same conditions. A silicon oxide layer of a 20 nm-thickness was formed. Thus, in the case that both hydrogen radicals and oxygen radicals were irradiated a forming velocity is above twice than that in the case that only oxygen radicals were irradiated.

It is considered that since hydrogen radicals etch oxide layer surfaces, an oxide layer forming speed in the case that both oxygen radicals and hydrogen radicals were irradiated is determined by an etching speed of hydrogen radicals, an oxidation speed of oxygen radicals, and an oxidation speed of water molecule radicals generated by the reaction of the oxygen radicals and the hydrogen radicals.

Figure 8A:
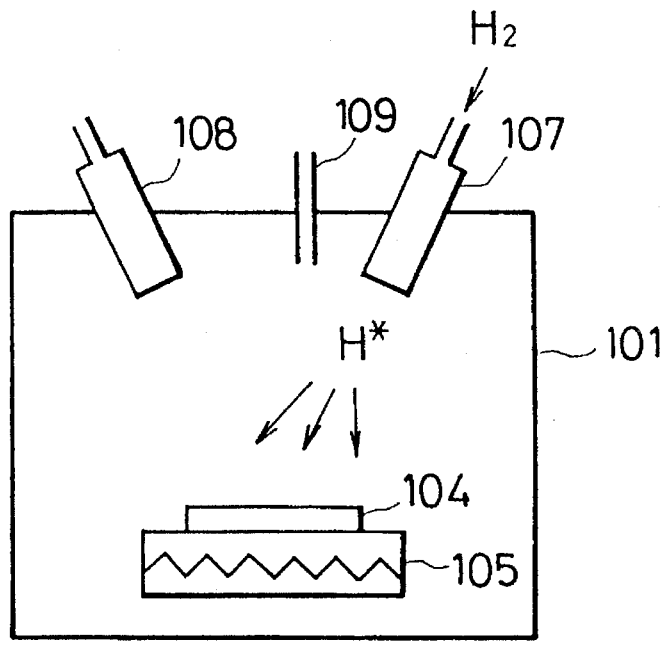
FIGS. 8A and 8B are explanatory views of a second example of a silicon oxide layer forming method using the low-temperature oxide layer forming apparatus of FIG. 6.
Figure 8B:
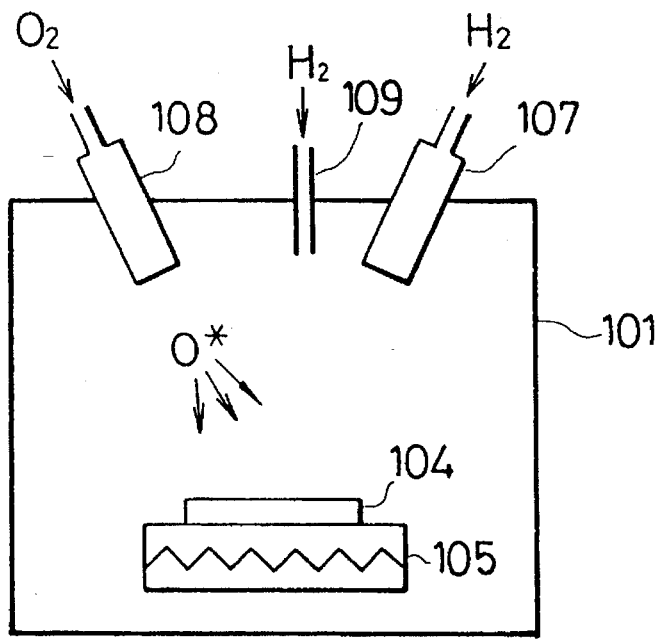

FIG. 8 is a diagrammatic sectional view explaining the formation of a silicon oxide layer according to a second example of the present invention. FIG. 8A shows the step of cleaning the surface of the silicon substrate described above, and FIG. 8B shows the step of forming silicon oxide layer.

As shown in FIG. 8B, following the step of cleaning the silicon oxide layer surface, neutral oxygen radical beams are formed in the oxygen radical source 108 and irradiated to the surface of the silicon substrate surface 104, while hydrogen is introduced through the hydrogen gas nozzle 109, and an oxide layer was formed for 30 minutes. A feed amount of hydrogen is about the same as in operating the hydrogen radical source.

After the oxide layer forming step, the silicon substrate was taken out through the load lock chamber 102, and a thickness of the silicon oxide layer on the surface was measured by ellipsometry. A silicon oxide layer of about 50 nm was formed on the surface of the silicon substrate.

Reasons for the silicon oxide layer being faster than the oxide layer forming speed in the example of FIG. 7 are considered as follows.

Hydrogen molecules of an about 10–7 torr partial pressure do not substantially etch a silicon oxide layer at a temperature below 700° C. In comparison with the example of FIG. 7, the second example has substantially zero speed of etching a silicon oxide layer. It is considered that an oxide layer forming speed increased the more.

Figure 9A:
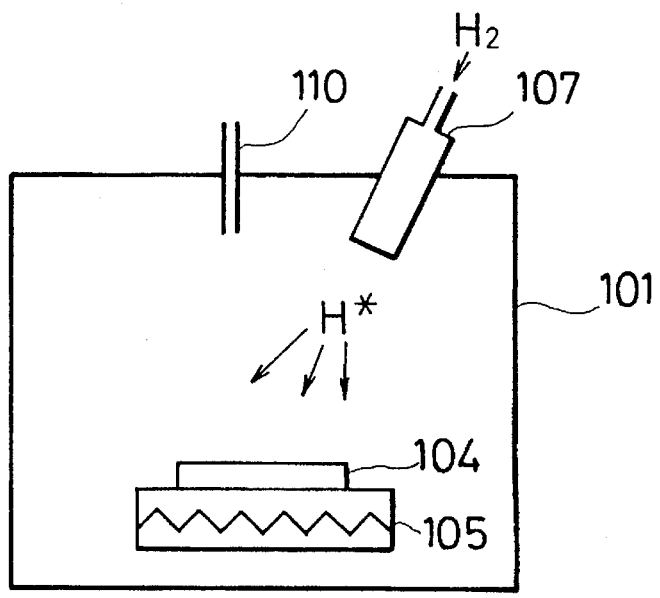
FIGS. 9A and 9B are explanatory views of a third example of a silicon oxide layer forming method using the low-temperature oxide layer forming apparatus of FIG. 6.
Figure 9B:
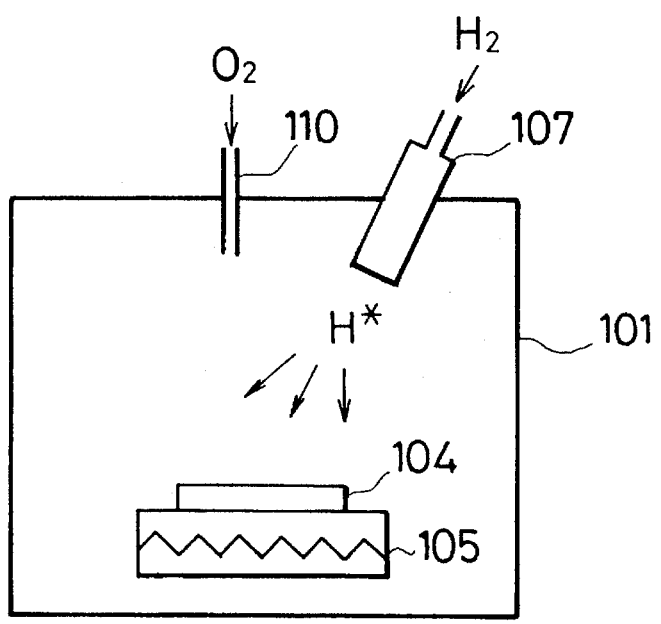

FIG. 9 is a diagrammatic sectional view explaining the formation of a silicon oxide layer according to a third example of the present invention. FIG. 9A shows the step of cleaning the silicon substrate surface described above, and FIG. 9B shows the step of forming a silicon oxide layer following the cleaning step.

As shown in FIG. 9B, following the step of cleaning the silicon substrate surface, neutral hydrogen radical beams are irradiated to the silicon substrate 104 while oxygen gas is concurrently introduced from the oxygen gas nozzle 110, and a silicon oxide layer was formed for 30 minutes.

After the formation of the oxide layer the silicon substrate 104 was taken out through the load lock chamber 102 a thickness of the silicon oxide layer on the silicon substrate by ellipsometry. The silicon oxide layer had a thickness of about 25 mm.

A reason for a difference in oxide layer forming speed between the examples FIGS. 7 and 8 is considered as follows.

Oxygen molecules of an about $10^{-7}$ torr partial pressure do not substantially oxidize silicon surfaces. The oxidation mechanism is dominated mainly by water molecule radicals. Etching with hydrogen radicals adds to this oxidation mechanism. In the hydrogen radical etching, the oxidation speed is lower than in FIGS. 7 and 8, but due to strong reduction of the hydrogen radicals, higher gettering can be expected.

In the above-described three methods, the silicon substrate temperatures are as low as 700° C., and no oxide layers are formed unless active radicals are involved. The oxide layer forming step can be controlled with precision only by turning on and off the substrate shutter disposed immediately before the silicon substrate. The method of forming silicon oxide layers is suitable to the sheet-by-sheet processing and is suitable to the formation of silicon oxide layers on large diameter-substrates.

Since the surfaces of silicon substrates are cleaned before the formation of silicon oxide layers, very thin silicon oxide layers of high purity can be formed. Since silicon layers are formed by low-temperature process in high vacuum, it is possible to protect semiconductor devices from adverse influences while to form silicon oxide layers of high quality.

To accelerate oxidation speeds, water molecules as an oxidant are produced on the surfaces of silicon substrate, water as a residual impurity in vacuum can be easily decreased.

In the above-described embodiments, any temperature range except a 550°–600° C. range can be used as long as a substrate temperature is below 700° C. The above-described embodiments include various modifications, improvements, combinations, etc.

The CVD apparatus according to a fourth embodiment of the present invention will be explained with reference to FIG. 10. The CVD apparatus according to the fourth embodiment comprises a usual CVD apparatus with the low-temperature oxide layer forming apparatus according to the third embodiment.

In the conventional CVD apparatus, when a semiconductor layer of Si or others is formed on a substrate by CVD, the substrate is taken out in the atmosphere and is heated again in the processing chamber to form an oxide layer. Accordingly the semiconductor layer is contaminated in the atmosphere, and it is difficult to form oxide layers of high quality.

The fourth embodiment is intended to form semiconductor layers having good characteristics and their oxide layers by combining the oxygen radical source and the hydrogen radical source with a CVD apparatus. A good semiconductor layer can be effectively grown by reducing off an the oxide layer on a Si substrate by irradiating hydrogen radicals before the crystal growth on the Si substrate.

Figure 10:
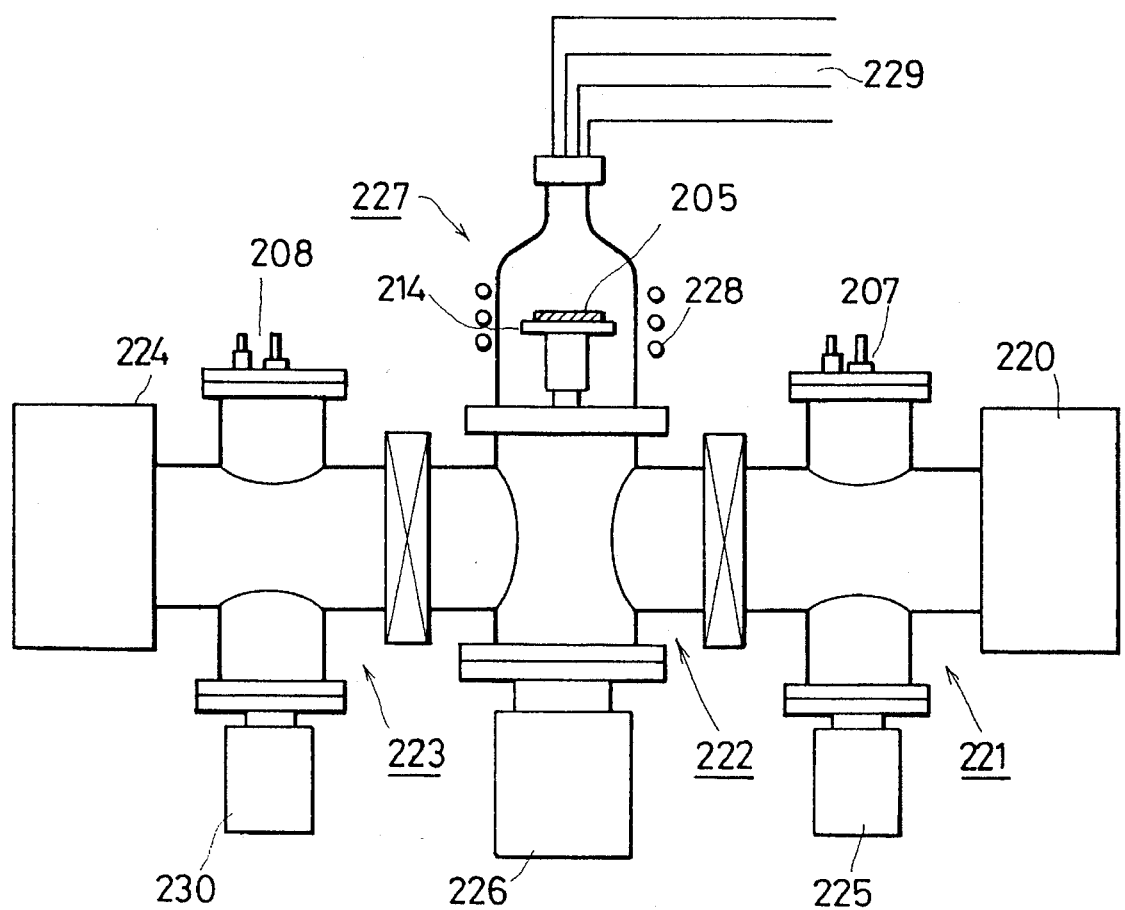
FIG. 10 is a view of a CVD apparatus according to a fourth embodiment of the present invention.

As shown in FIG. 10, the CVD apparatus according to the fourth embodiment comprises a loading chamber 220 for loading a substrate, a cleaning chamber 221 for cleaning the substrate by irradiating neutral hydrogen radical beams to the substrate, a main chamber 222 for growing a semiconductor layer on the substrate, an oxidation chamber 223 for oxidizing the semiconductor layer by irradiating neutral oxygen radical beams thereto, and an unloading chamber 224 for taking out the substrate.

The cleaning chamber 221 includes a hydrogen radical source 207 and a substrate manipulator 225 for driving the substrate.

The main chamber 222 includes a substrate manipulator 226 and a vertical-type reactor 227 for CVD growth on the substrate. An RF coil 228 is disposed outside the reactor 227.

An Si substrate 205 is mounted on a susceptor 214 driven by the substrate manipulator 226. Four gas introduction lines 229 are provided on the top of the reactor 227.

The oxidation chamber 223 includes an oxygen radical source 208 and a substrate manipulator 230 for driving the substrate.

The operation procedure of the CVD apparatus according to the a fourth embodiment of the present invention will be explained.

A substrate transferred from the loading chamber 220 is subjected to low-temperature cleaning in the cleaning chamber 221 by irradiation of neutral hydrogen radical beams, and then is transferred to the substrate manipulator 226 in the main chamber 222 by a substrate transfer mechanism.

The substrate is introduced into the vertical-type reactor 227 by the linear motion driven mechanism of the substrate manipulator 226 and is heated by the susceptor 214 of graphite by induction heating of the RF coil 228.

The susceptor 214 is set on rotation by a rotary motion driven mechanism of the substrate manipulator 226 during growth.

During the Si CVD growth, silane ($SiH_4$) or disilane ($Si_2H_6$) is fed through the gas introduction lines 229, and a vacuum degree in the interior of the reactor is retained at ~10–5 torr, and a substrate temperature is maintained at 550°–700° C.

Then, the substrate is transferred to the oxidation chamber 223 by the substrate transfer mechanism. An oxide layer is formed by irradiation of neutral oxygen radical beams from the hydrogen radical source 208 with a substrate temperature set at 600° C., and next the substrate is carried to the unloading chamber 224 by the substrate transfer mechanism.

Thus, according to the fourth embodiment, a silicon layer was formed on an Si substrate, and then, without being taken out into the atmosphere, a gate oxide layer was formed on the silicon layer. As a result, a voltage resistance could be improved from the conventional 9 MV/cm to 11.5 MV/cm.

The MBE apparatus according to a fifth embodiment of the present invention will be explained with reference to FIG. 11. The MBE apparatus according to the fifth embodiment comprises a conventional MBE apparatus, and the low-temperature oxide layer forming apparatus according to the third embodiment.

In the conventional MBE apparatus, when a semiconductor layer of Si or others is formed on a substrate by MBE, the substrate is taken out into the atmosphere and is heated again in the processing chamber to form an oxide layer. Accordingly the semiconductor layer is contaminated in the atmosphere, and it is difficult to form oxide layers of high quality.

Then the fifth embodiment is intended to form semiconductor layers having good characteristics and their oxide layers by combining an oxygen radical source and a hydrogen radical source with an MBE apparatus. A good semiconductor layer can be effectively grown by reducing off an the oxide layer on a Si substrate by irradiating neutral hydrogen radical beams before the crystal growth on the Si substrate.

Figure 11:
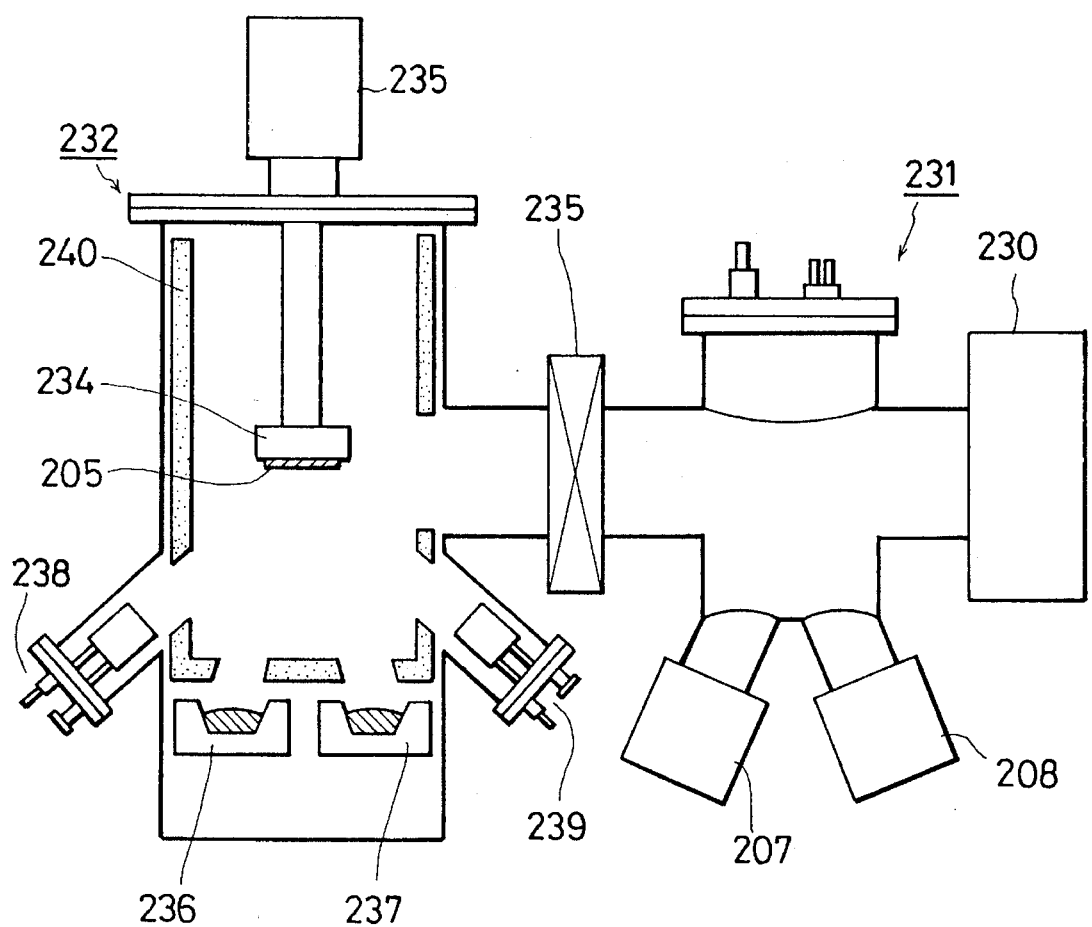
FIG. 11 is a view of an MBE apparatus according to a fifth embodiment of the present invention.

The MBE apparatus according to the fifth embodiment includes, as shown in FIG. 11, a load lock chamber 230 for carrying in and out a substrate, a processing chamber 231 for cleaning the substrate by irradiating hydrogen radical bemas or neutral oxygen radical beams to oxidize the substrate, and a growth chamber 232 for conducting MBE.

On the top of the processing chamber 231 there is provided a substrate manipulator for driving the substrate. On the underside of the processing chamber 231 there are provided an oxygen radical source 208 and a hydrogen radical source 207.

A substrate manipulator 235 is provided on the top of the growth chamber 232 adjacent to the processing chamber 231 through a gate valve 235. The substrate manipulator 235 drives a heat 234 with the Si substrate 205 mounted on.

On the bottom of the growth chamber 232 there are provided electron beam evaporators 236, 237, and molecular beam sources 238, 239 for vaporizing dopants. A liquid $N_2$ shroud 240 is provided on the inside of the wall of the growth chamber 232.

Next, the operational procedure of the MBE apparatus according to the fifth embodiment will be explained.

An Si substrate 205 in the load lock chamber 230 is subjected to low-temperature cleaning by irradiation of neutral hydrogen radical beams from the hydrogen radical source 207. Then the Si substrate 205 is carried by a substrate transfer mechanism (not shown) to the substrate manipulator 235 in the growth chamber 232 to be held there.

Subsequently the Si substrate 205 is again transferred to the processing chamber 231, and neutral oxygen radical beams from the oxygen radical source 208 are irradiated to the substrate 205 for the oxidation.

Thus, according to the present embodiment, a string of processing for the formation of a semiconductor layer and the oxidation of the surface of the semiconductor layer is conducted in the reactor without exposing the substance to the atmosphere. As a result, semiconductor layers and oxide layers thereof of high layer quality can be formed.

What is claimed is:

1. A beam generating apparatus disposed in a vacuum processing chamber for processing a substrate, for emitting activated beams into the processing chamber, the beam generating apparatus comprising:

a beam generating cell for generating the activated beams, the beam generating cell having a speculum contact surface;

a gas introduction member for introducing gas into the beam generating cell, the gas introduction member having a speculum contact surface;

a bellows members connected to the gas introduction member, for pressing the contact surface of the gas introduction member against the contact surface of the beam generating cell so as to vacuum-seal a contact between the beam generating cell and the gas introduction member.

2. A beam generating apparatus according to claim 1, wherein the beam generating cell includes:

a gas storing portion for storing introduced gas, the gas storing portion having a speculum contact surface; and an aperture plate with apertures for emitting the activated beams, for closing the gas storing portion, the aperture plate having a speculum contact surface, the bellows member pressing the contact surface of the gas storing portion on the contact surface of the aperture plate so as to vacuum-seal a contact between the gas storing portion and the aperture plate.

3. A beam generating apparatus according to claim 1, further comprising high-frequency applying means for applying a high frequency wave to the beam generating cell, the high frequency wave being applied from the high frequency applying means to the gas introduced into the beam generating cell to make electric discharges and generate radical atoms, radical/atomic beams being emitted from the beam generating cell into the processing chamber.

4. A beam generating apparatus according to claim 2, further comprising high-frequency applying means for applying a high frequency wave to the beam generating cell, the high frequency wave being applied from the high frequency applying means to the gas introduced into the beam generating cell to make electric discharges and generate radical atoms, radical/atomic beams being emitted from the beam generating cell through the apertures into the processing chamber.

5. A beam generating apparatus according to claim 1, further comprising heating means for heating the beam generating cell, the heating means heating the gas introduced into the beam generating cell to decompose the gas, molecular beams being emitted from the beam generating cell into the processing chamber.

6. A beam generating apparatus according to claim 2, further comprising heating means for heating the beam generating cell, the heating means heating the gas introduced into the beam generating cell to decompose the gas, molecular beams being emitted from the beam generating cell through the apertures into the processing chamber.

7. An apparatus for fabricating semiconductor devices comprising:

a vacuum processing chamber for processing a substrate;

a first beam generating apparatus according to claim 3 disposed in the processing chamber, for emitting hydrogen plasma beams; and a second beam generating apparatus according to claim 3 disposed in the processing chamber, for emitting oxygen plasma beams.

8. An apparatus for fabricating semiconductor devices comprising:

a crystal growth unit with a growth chamber for growth a semiconductor layer on a substrate;

a processing chamber for processing the substrate, the processing chamber being connected to the growth chamber of the crystal growth unit through a gate valve;

a first beam generating apparatus according to claim 3 disposed in the processing chamber, for emitting hydrogen plasma beams; and a second beam generating apparatus according to claim 3 disposed in the processing chamber, for emitting oxygen plasma beams.

9. An apparatus for fabricating semiconductor devices according to claim 8, wherein the crystal growth unit is a CVD apparatus for growing the semiconductor layer on the substrate by CVD.

10. An apparatus for fabricating semiconductor devices according to claim 8, wherein the crystal growth unit is an MBE apparatus for growing the semiconductor layer on the substrate by MBE.

11. An apparatus for fabricating semiconductor devices according to claim 10, wherein a third beam generating apparatus according to claim 5 for emitting molecular beams is disposed in the growth chamber.

12. An apparatus for fabricating semiconductor devices according to claim 8, further comprising:

a cleaning chamber for cleaning the substrate, the cleaning chamber being connected to the growth chamber of the crystal growth unit through a gate valve; and a fourth beam generating apparatus according to claim 3 disposed in the cleaning chamber, for emitting hydrogen plasma beams.

13. An apparatus for fabricating semiconductor devices according to claim 9, further comprising:

a cleaning chamber for cleaning the substrate, the cleaning chamber being connected to the growth chamber of the crystal growth unit through a gate valve; and a fourth beam generating apparatus according to claim 3 disposed in the cleaning chamber, for emitting hydrogen plasma beams.

14. An apparatus for fabricating semiconductor devices according to claim 10, further comprising:

a cleaning chamber for cleaning the substrate, the cleaning chamber being connected to the growth chamber of the crystal growth unit through a gate valve; and a fourth beam generating apparatus according to claim 3 disposed in the cleaning chamber, for emitting hydrogen plasma beams.

15. An apparatus for fabricating semiconductor devices according to claim 11, further comprising:

a cleaning chamber for cleaning the substrate, the cleaning chamber being connected to the growth chamber of the crystal growth unit through a gate valve; and a fourth beam generating apparatus according to claim 3 disposed in the cleaning chamber, for emitting hydrogen plasma beams.

* * * * *